United States Patent
Shibata et al.

(10) Patent No.: US 7,550,821 B2
(45) Date of Patent: Jun. 23, 2009

(54) NITRIDE SEMICONDUCTOR DEVICE

(75) Inventors: Daisuke Shibata, Osaka (JP); Kazushi Nakazawa, Osaka (JP); Masahiro Hikita, Hyogo (JP); Yasuhiro Uemoto, Shiga (JP); Tetsuzo Ueda, Osaka (JP); Manabu Yanagihara, Osaka (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/952,407

(22) Filed: Dec. 7, 2007

(65) Prior Publication Data

US 2008/0149940 A1 Jun. 26, 2008

(30) Foreign Application Priority Data

Dec. 19, 2006 (JP) ............................. 2006-341024

(51) Int. Cl.
*H01L 29/20* (2006.01)
(52) U.S. Cl. .................. 257/615; 257/76; 257/E29.091
(58) Field of Classification Search ................ 257/155, 257/260, 284, 613
See application file for complete search history.

(56) References Cited

U.S. PATENT DOCUMENTS

2003/0181017 A1* 9/2003 Mikawa et al. .............. 438/393
2006/0157804 A1* 7/2006 Ueda ........................... 257/401
2007/0020799 A1* 1/2007 Choi et al. .................. 438/103

OTHER PUBLICATIONS

Saito et al. "High Breakdown Voltage AlGaN-GaN Power-HEMT Design and High Current Density Switching Behavior", IEEE Transaction on Electron Devices, vol. 50, No. 12, pp. 2528-2531, Dec. 2003.

* cited by examiner

*Primary Examiner*—N Drew Richards
*Assistant Examiner*—Mamadou Diallo
(74) *Attorney, Agent, or Firm*—McDermott Will & Emery LLP

(57) ABSTRACT

A nitride semiconductor device includes: a substrate; a nitride semiconductor layer formed on a main surface of the substrate and having a channel region through which electrons drift in a direction parallel to the main surface; and a plurality of first electrodes and a plurality of second electrodes formed spaced apart from each other on an active region in the nitride semiconductor layer. An interlayer insulating film is formed on the nitride semiconductor layer. The interlayer insulating film has openings that respectively expose the first electrodes and has a planarized top surface. A first electrode pad is formed in a region over the active region in the interlayer insulating film and is electrically connected to the exposed first electrodes through the respective openings.

11 Claims, 7 Drawing Sheets

NITRIDE SEMICONDUCTOR DEVICE

CROSS REFERENCE TO RELATED APPLICATION

This application claims priority under 35 U.S.C. §119 on Patent Application No. 2006-341024 filed in Japan on Dec. 19, 2006, the entire contents of which are hereby incorporated by reference. The entire contents of Patent Application No. 2007-268772 filed in Japan on Oct. 16, 2007 are also incorporated by reference.

BACKGROUND OF THE INVENTION

1. Field of the Invention

The invention relates to a nitride semiconductor device. More particularly, the invention relates to a nitride semiconductor device that is used as a power device in, e.g., power supply circuits of household appliances.

2. Background Art

A nitride semiconductor represented by the general formula $Al_xIn_yGa_{1-x-y}N$ (where $x \leq 0$, $y \leq 0$, and $0 \leq x+y \leq 1$) is a wide gap semiconductor having a wide band gap. Therefore, this nitride semiconductor has a higher breakdown field and a higher saturated electron drift velocity as compared to a compound semiconductor such as gallium arsenide (GaAs), a silicon (Si) semiconductor, and the like.

In a hetero structure of aluminum gallium nitride (AlGaN) and gallium nitride (GaN), charges are generated at a heterointerface due to spontaneous polarization and piezoelectric polarization on the (0001) plane, and a sheet carrier density of $1 \times 10^{13}$ cm$^{-2}$ or higher is obtained even though impurities are not added intentionally. Therefore, a high current-density heterojunction field effect transistor (HFET) can be implemented by using a two-dimensional electron gas (2DEG) generated at the heterointerface.

Nitride semiconductor-based power transistors have been therefore widely investigated and developed, and an on-resistance as low as one tenth or less of a Si-based metal oxide semiconductor field effect transistor (MOSFET) and one third or less of an insulated gate bipolar transistor (IGBT) has been implemented in the fields that require a breakdown voltage of 200 V or higher (e.g., see W. Saito et al., "IEEE Transactions on Electron Devices," 2003, Vol. 50, No. 12, p. 2528). In a nitride semiconductor device, the size of an active region can be made smaller than in a Si-based semiconductor device. Therefore, reduction in size of the semiconductor device has also been expected for the nitride semiconductor device.

In a conventional nitride semiconductor device, the size of the active region can be reduced to about one third to about one tenth of the size of the active region of a Si-based semiconductor device. However, since an electrode pad for connecting wirings occupies a large area, the size of the nitride semiconductor device cannot be reduced sufficiently. For example, a nitride semiconductor device shown in FIG. 8 has a drain electrode pad 125 connected to drain electrodes 118, a source electrode pad 126 connected to source electrodes 117, and a gate electrode pad 129 connected to gate electrodes 119. In this case, the area required for the nitride semiconductor device is about three times as large as the area of an active region 130. It is possible to reduce the size of an electrode pad, but such reduction in size of the electrode pad is limited in view of the yield.

It is also possible to form an electrode pad over the active region. In a nitride semiconductor device, however, a channel through which electrons drift extends in a direction parallel to a main surface of a substrate. Therefore, not only a gate electrode but a source electrode and a drain electrode are formed over the active region. In a power device, for example, a voltage of several hundreds of volts is applied between the drain electrode pad and the source electrode. It is therefore difficult to assure insulation between the drain electrode pad and the source electrode with a normal interlayer insulating film.

Moreover, in the case where an electrode pad is formed over the active region in the multi-finger nitride semiconductor device as shown in FIG. 8, the electrode pad and an electrode formed right under the electrode pad need to be connected to each other through a plug. It is therefore difficult to assure flatness of the electrode pad.

SUMMARY OF THE INVENTION

The invention is made to solve the above problems, and it is an object of the invention to implement a nitride semiconductor device having a smaller device area while assuring the area of an electrode pad.

In order to achieve the above object, in a nitride semiconductor device of the invention, an electrode pad is formed over an active region.

More specifically, a nitride semiconductor device according to the invention includes a substrate, a nitride semiconductor layer, a plurality of first electrodes, a plurality of second electrodes, a first insulating film, an interlayer insulating film, and a first electrode pad. The nitride semiconductor layer is formed on a main surface of the substrate and has a channel region through which electrons drift in a direction parallel to the main surface. The plurality of first electrodes and the plurality of second electrodes are formed spaced apart from each other so as to be alternately arranged on an active region in the nitride semiconductor layer. The first insulating film and the interlayer insulating film are sequentially formed on the nitride semiconductor layer in this order and have a plurality of openings that expose the respective first electrodes. The first electrode pad is formed in a region on the interlayer insulating film over the active region and is electrically connected to an exposed portion of each of the first electrodes through the respective openings.

A so-called pad-on-chip structure can be implemented by the nitride semiconductor device of the invention. Therefore, the size of the nitride semiconductor device is reduced by the area of the first electrode pad.

DETAILED DESCRIPTION OF THE PREFERRED EMBODIMENTS

First Embodiment

Figure 1:
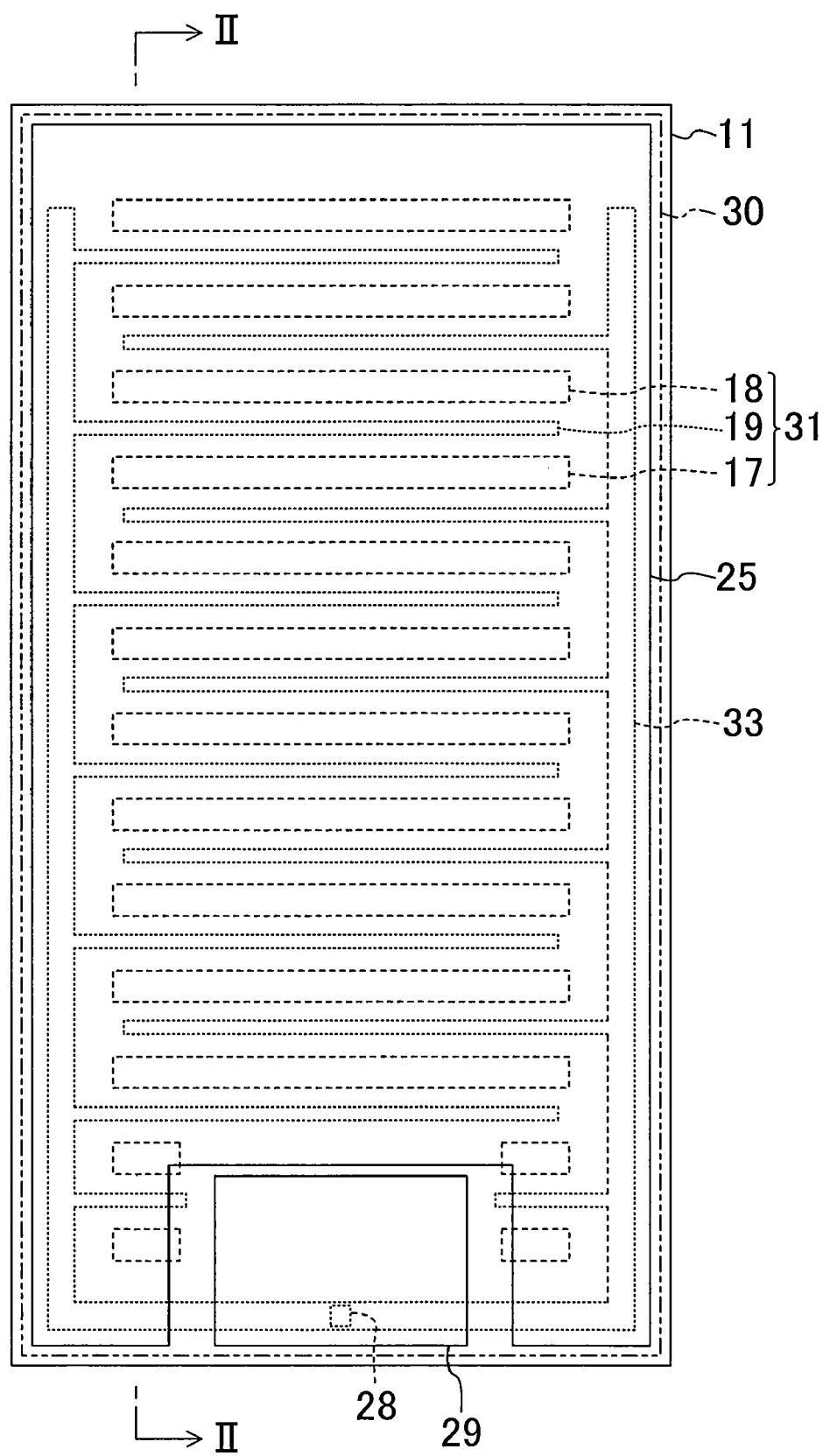
FIG. 1 is a plan view of a nitride semiconductor device according to a first embodiment of the invention.
Figure 2:
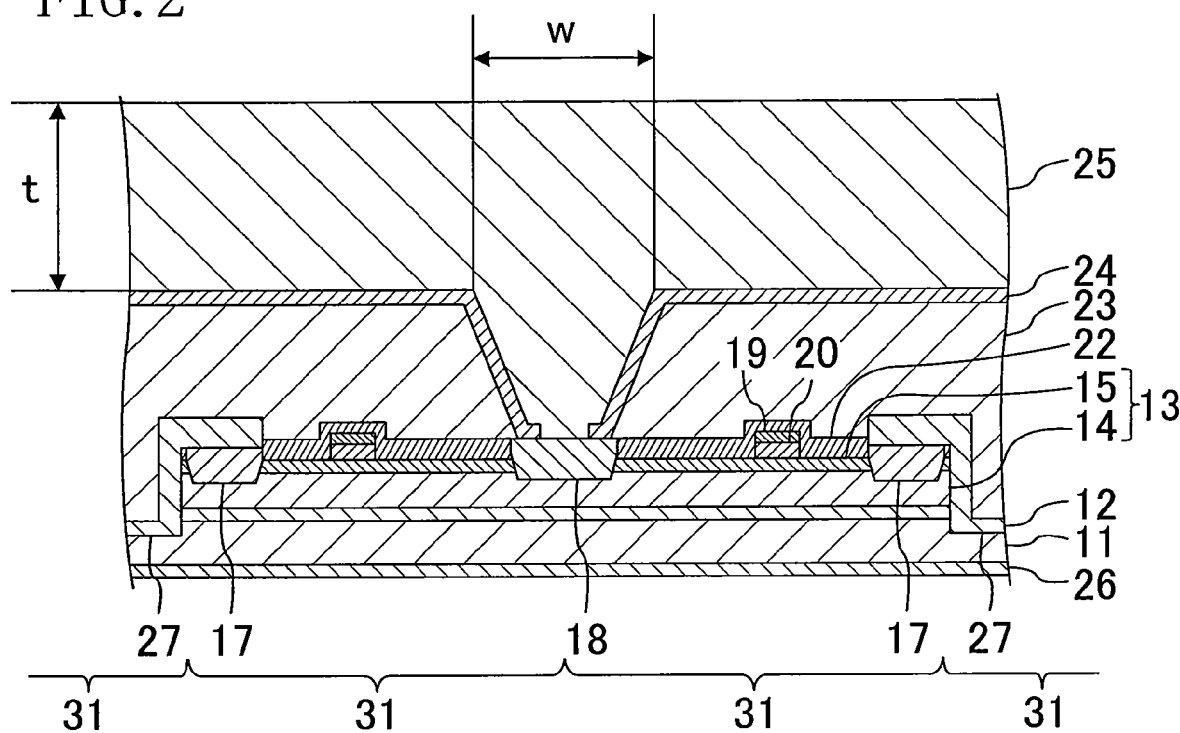
FIG. 2 is a cross-sectional view of the nitride semiconductor device according to the first embodiment of the invention.

Hereinafter, a first embodiment of the invention will be described with reference to the accompanying drawings. FIG. 1 shows a planar structure of a nitride semiconductor device of the first embodiment. FIG. 2 shows a cross-sectional structure taken along line II-II in FIG. 1.

As shown in FIGS. 1 and 2, the nitride semiconductor device of the first embodiment has a nitride semiconductor layer 13 formed on an electrically conductive silicon (Si) substrate 11 with a buffer layer 12 interposed therebetween. The nitride semiconductor layer 13 is formed from an undoped gallium nitride (GaN) layer 14 having a thickness of 2 μm and an undoped aluminum gallium nitride (AlGaN) layer 15 having a thickness of 25 nm. The undoped GaN layer 14 and the undoped AlGaN layer 15 are sequentially formed over the substrate 11 in this order. A two-dimensional electron gas (2DEG) is generated in an interface region of the undoped GaN layer 14 with the undoped AlGaN layer 15, forming a channel region.

A source electrode 17 and a drain electrode 18 are formed spaced apart from each other on the nitride semiconductor layer 13. In this embodiment, in order to reduce a contact resistance, the undoped AlGaN layer 15 and a part of the undoped GaN layer 14 are removed in the regions of the source electrode 17 and the drain electrode 18 so that the source electrode 17 and the drain electrode 18 reach a level lower than the interface between the undoped AlGaN layer 15 and the undoped GaN layer 14. The source electrode 17 and the drain electrode 18 are formed from titanium (Ti) and aluminum (Al).

A p-type AlGaN layer 20 having a thickness of 200 nm is formed in a stripe shape between the source electrode 17 and the drain electrode 18. A gate electrode 19 is formed on the p-type AlGaN layer 20. The gate electrode 19 is formed from palladium (Pd).

The nitride semiconductor device of this embodiment is a multi-finger field effect transistor (FET). More specifically, provided that a source electrode 17, a gate electrode 19, and a drain electrode 18 form a unit 31, a plurality of units 31 are arranged so as to be alternately inverted with respect to each drain electrode 18. As described below, the source electrodes 17, the gate electrodes 19, and the drain electrodes 18 of the plurality of units 31 are respectively electrically connected to each other. This structure enables the nitride semiconductor device to have a very wide gate width, whereby a power device capable of high current operation can be implemented. In this embodiment, a region except an isolation region in the nitride semiconductor layer 13, that is, a region where a group of source electrodes 17 and drain electrodes 18 are formed and a channel region in the nitride semiconductor layer 13, is referred to as an active region 30.

A first insulating film 22 is formed on the nitride semiconductor layer 13 except on the source electrode 17 and the drain electrode 18. The first insulating film 22 is formed from silicon nitride (SiN). The first insulating film 22 is provided to stabilize the surface of the nitride semiconductor layer 13 and to prevent water from entering the nitride semiconductor layer 13 from an interlayer insulating film 23 as described below.

The interlayer insulating film 23 is formed on the first insulating film 22. For example, the interlayer insulating film 23 is a phosphorus (P)-containing silicon oxide ($SiO_2$) film having a thickness of 6 μm and has a planarized top surface. The interlayer insulating film 23 has an opening that exposes the drain electrode 18 in each unit 31. In this embodiment, the opening has a width w of 4.5 μm. The opening is tapered in the example shown in FIG. 2. However, the opening need not necessarily be tapered.

Using the phosphorus-doped $SiO_2$ film as the interlayer insulating film 23 reduces stress of the interlayer insulating film 23 and prevents film separation. Moreover, the gettering effect of phosphorus prevents alkaline impurities from entering the active region. As a result, reliability of the semiconductor device can be improved.

A second insulating film 24 is formed so as to cover the top surface of the interlayer insulating film 23 and the side surface of the opening. The second insulating film 24 is a silicon nitride (SiN) film having a thickness of 0.2 μm.

A first electrode pad 25 is formed in a region over a part of the active region 30 on the second insulating film 24. The first electrode pad 25 is formed from aluminum (Al) and copper (Cu) and has a thickness of 4 μm. The first electrode pad 25 fills the opening having its side surface covered with the second insulating film 24. The first electrode pad 25 is thus electrically connected to the drain electrode 18 exposed from the opening.

A second electrode pad 26 is formed on the back surface of the substrate 11, that is, on the opposite surface of the substrate 11 from the nitride semiconductor layer 13. For example, the second electrode pad 26 is formed from gold (Au) and tin (Su). The source electrode 17 of each unit 31 is electrically connected to the second electrode pad 26 through a corresponding via plug 27 and the electrically conductive substrate 11. The via plug 27 extends through the nitride semiconductor layer 13 and is electrically connected to the substrate 11.

The respective gate electrodes 19 of the plurality of units 31 are electrically connected to each other through a gate electrode line 33. The gate electrode line 33 is electrically connected to a gate electrode pad 29 through a via plug 28. The gate electrode pad 29 is formed in a region over the active region 30 on the second insulating film 24 and is insulated from the first electrode pad 25. The gate electrode pad 29 may alternatively be formed in a region other than the region over the active region 30.

In the nitride semiconductor device of this embodiment, the first electrode pad 25 and the gate electrode pad 29 are formed over the active region 30. Therefore, the area of the nitride semiconductor device can be reduced by the area of the first electrode pad 25 compared to the case where the first electrode pad 25 is formed in a region other than the region over the active region 30.

In the example shown in this embodiment, a phosphorus added silicon oxide film is as the interlayer insulating film 23. However, a polyimide film, a benzocyclobutene (BCB) film, or the like may alternatively be used. Since films such as a polyimide film and a BCB film can be formed by a spin coating method, it is easy to fill a recess with the film and to planarize the top surface of the interlayer insulating film 23. In the case where a polyimide film or a BCB film is used as the interlayer insulating film 23, a polyimide film or a BCB film is first formed by a spin coating method and an opening that exposes the drain electrode 18 is then formed in the polyimide or BCB film by a dry etching method using a hard mask of, e.g., $SiO_2$. Alternatively, polyimide or BCB may be provided with photosensitivity and an opening may be formed by exposure and development of the polyimide or BCB film. In this case, by curing the polyimide or BCB film at about 350° C. after development, the opening can be forward tapered, and excellent coverage can be obtained when the first electrode pad is formed.

When a polyimide film is used as the interlayer insulating film 23, the interlayer insulating film 23 expands due to the hygroscopic property of polyimide, and reliability of the semiconductor device may be degraded by cracks and water. When a BCB film is used as the interlayer insulating film 23, reliability of the semiconductor device may be degraded by water due to the water permeability of BCB. However, initial malfunction and degradation of reliability of the semiconductor device due to water can be suppressed by forming a water-resistant second insulating film 24 such as a SiN film on the interlayer insulating film 23. Forming the water-resistant second insulating film 24 also enables a wet etching method to be used to etch the electrode pad. In this embodiment, the second insulating film 24 is formed on the whole surface of the interlayer insulating film 23. However, the influence of water can be reduced by forming the second insulating film 24 at least on a region that is not covered by the first electrode pad 25 and the gate electrode pad 29. It should be noted that the second insulating film 24 need not necessarily be formed.

The first insulating film 22 formed under the interlayer insulating film 23 also suppresses degradation of the semiconductor device which is caused by water.

The breakdown field strength of the silicon oxide film and the polyimide film and the BCB film formed by a CVD (Chemical Vapor Deposition) method is about 3 MV/cm. However, in view of the uneven profile of the nitride semiconductor device, variation in film characteristics, and the like, the nitride semiconductor device needs to be designed with the breakdown field strength of about 1 MV/cm. Accordingly, in order to implement a nitride semiconductor device with a breakdown voltage of 200 V or higher, it is preferable to form the interlayer insulating film with a thickness of 2 μm or more. A higher breakdown voltage can be implemented by forming the interlayer insulating film with a thickness of 5 μm or more. A breakdown voltage can further be improved by forming the interlayer insulating film with a thickness of 10 μm or more. A too thick interlayer insulating film causes problems such as too much side etching of the interlayer insulating film by a wet etching method upon forming an opening. Therefore, the thickness of the interlayer insulating film is preferably 25 μm or less, and more preferably, 20 μm or less.

The first electrode pad 25 is wire-bonded in an assembly step. In order to increase the contact area of the electrode pad surface and the wires and thus to reduce the wiring resistance and improve the wire bonding yield, it is preferable that the first electrode pad 25 has a flat top surface. In order to form the first electrode pad 25 with a flat top surface, it is preferable that the thickness t of the first electrode pad 25 is one half or more of the width w of the opening that exposes the drain electrode 18. For planarization, it is more preferable that the thickness t is equal to or larger than the width w.

Figure 3:
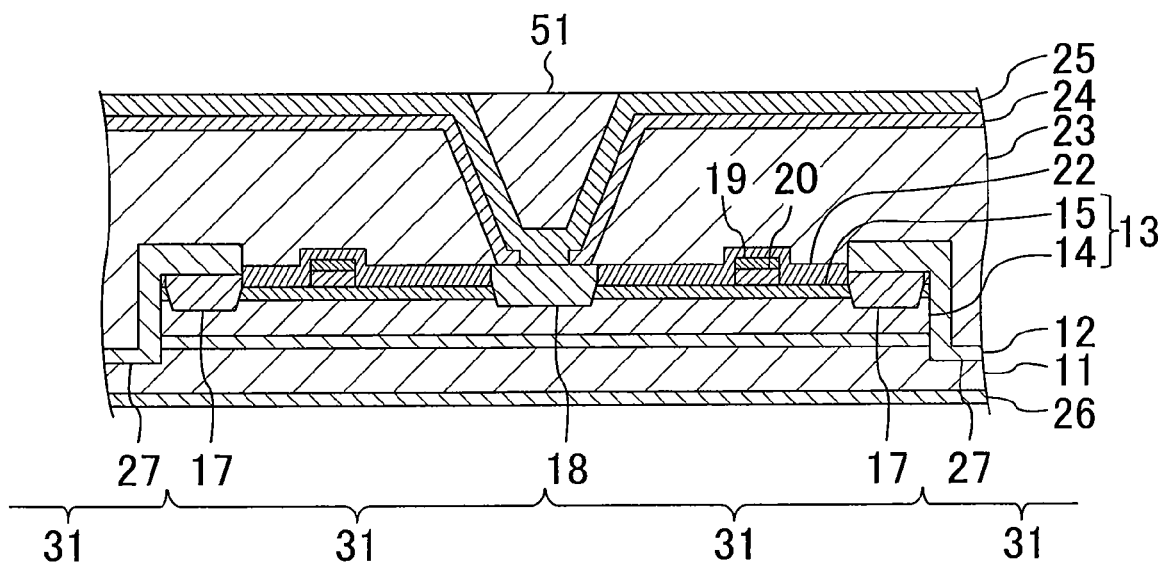
FIG. 3 is a cross-sectional view of a modification of the nitride semiconductor device according to the first embodiment of the invention.

As shown in FIG. 3, when the thickness t of the first electrode pad 25 is less than one half of the width w of the opening, a recess is formed with its side and bottom surfaces covered with the first electrode pad 25. In this case, the top surface of the first electrode pad 25 may be planarized by filling the recess with a filling layer 51. The filling layer 51 may be formed by forming an insulating film on the first electrode pad 25 so as to fill the recess and then polishing the insulating film by a CMP (Chemical Mechanical Polishing) method or the like until the first electrode pad 25 is exposed.

The insulating film may be a polyimide film, a SiN film, a $SiO_2$ film, or the like. The polyimide film may be formed by, e.g., a spin coating method, and the SiN film and the $SiO_2$ film may be formed by a plasma CVD method. The filling layer 51 may be formed from an electrically conductive material. Using such an electrically conductive filling layer 51 not only planarizes the top surface of the first electrode pad 25 but also make the entire pad surface electrically conductive. Therefore, a contact resistance with the wire can be reduced.

Figure 4:
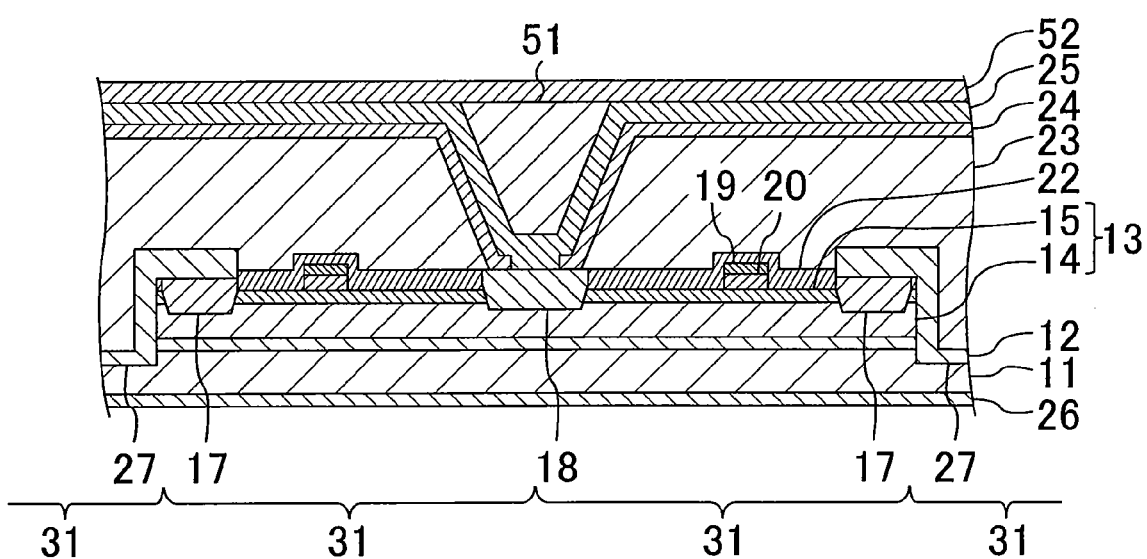
FIG. 4 is a cross-sectional view of a modification of the nitride semiconductor device according to the first embodiment of the invention.

As shown in FIG. 4, after planarization by the filling layer 51, a metal film 52 may be formed on the first electrode pad 25. Like the first electrode pad 25, the metal film 52 may be formed from aluminum (Al) and copper (Cu). The metal film 52 may alternatively be formed from gold (Au) or the like.

Figure 5:
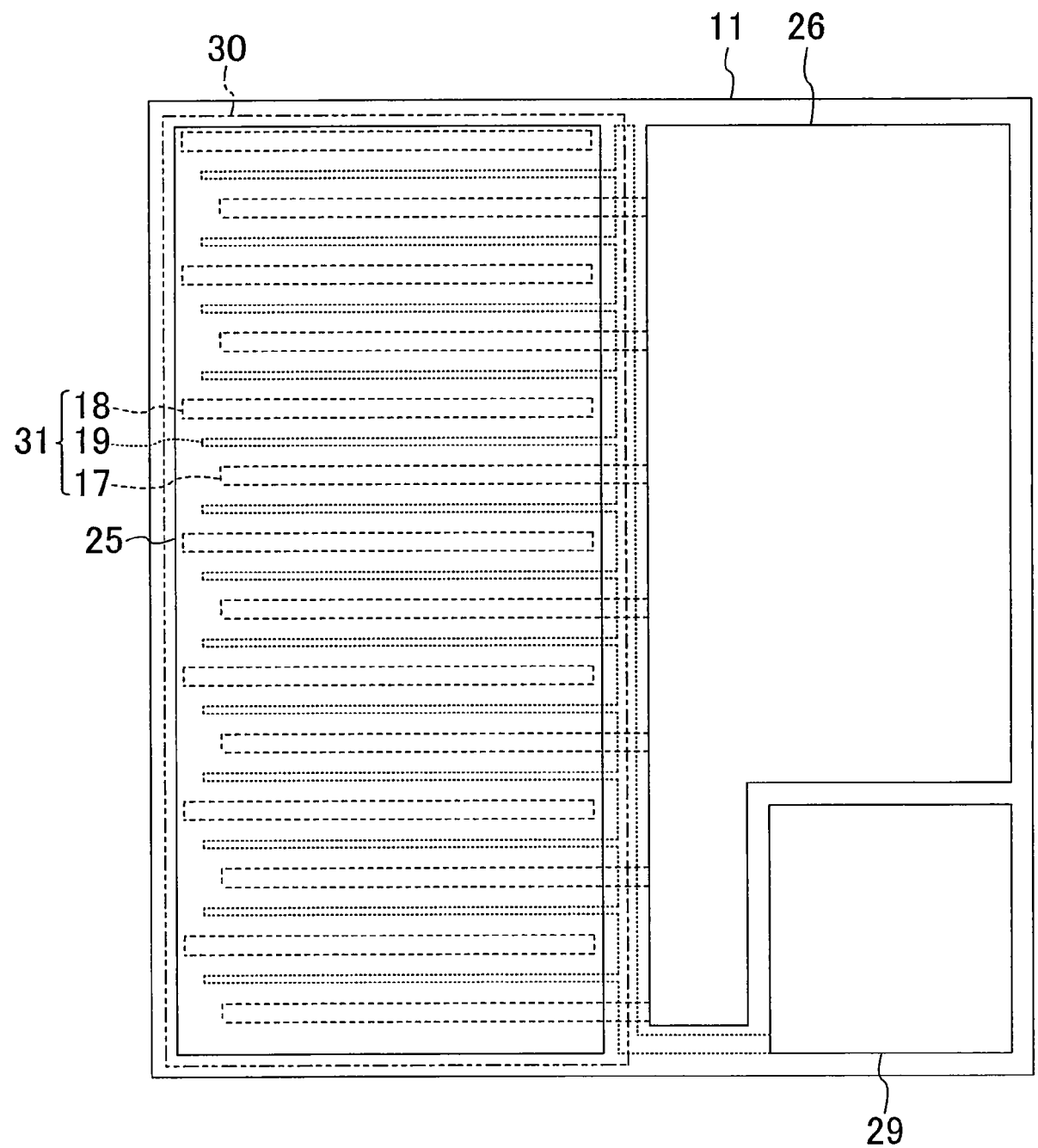
FIG. 5 is a plan view of a modification of the nitride semiconductor device according to the first embodiment of the invention.

In this embodiment, the second electrode pad 26 is formed on the back surface of the substrate 11. Therefore, the area of the nitride semiconductor device can further be reduced. Moreover, by connecting the second electrode pad 26 to the ground, a source-via grounding structure can be formed and the source electrode 17 can be connected to the ground. Therefore, an on-resistance can be reduced. It should be noted that, as shown in FIG. 5, the first electrode pad 25, the second electrode pad 26, and the gate electrode pad 29 may be formed on the same side of the substrate 11. In this case as well, since the first electrode pad 25 is formed over the active region 30, the area of the semiconductor device can be reduced.

A silicon (Si) substrate whose main surface has an orientation of (111) plane may be used as the substrate 11. However, the invention is not limited to this, and any substrate may be used as long as the substrate is electrically conductive and a nitride semiconductor layer can be grown on the substrate. An insulating substrate may be used when the source-via grounding structure is not used.

In this embodiment, the drain electrode 18 is connected to the first electrode pad 25. However, the source electrode 17 may be connected to the first electrode pad 25.

Second Embodiment

Figure 6:
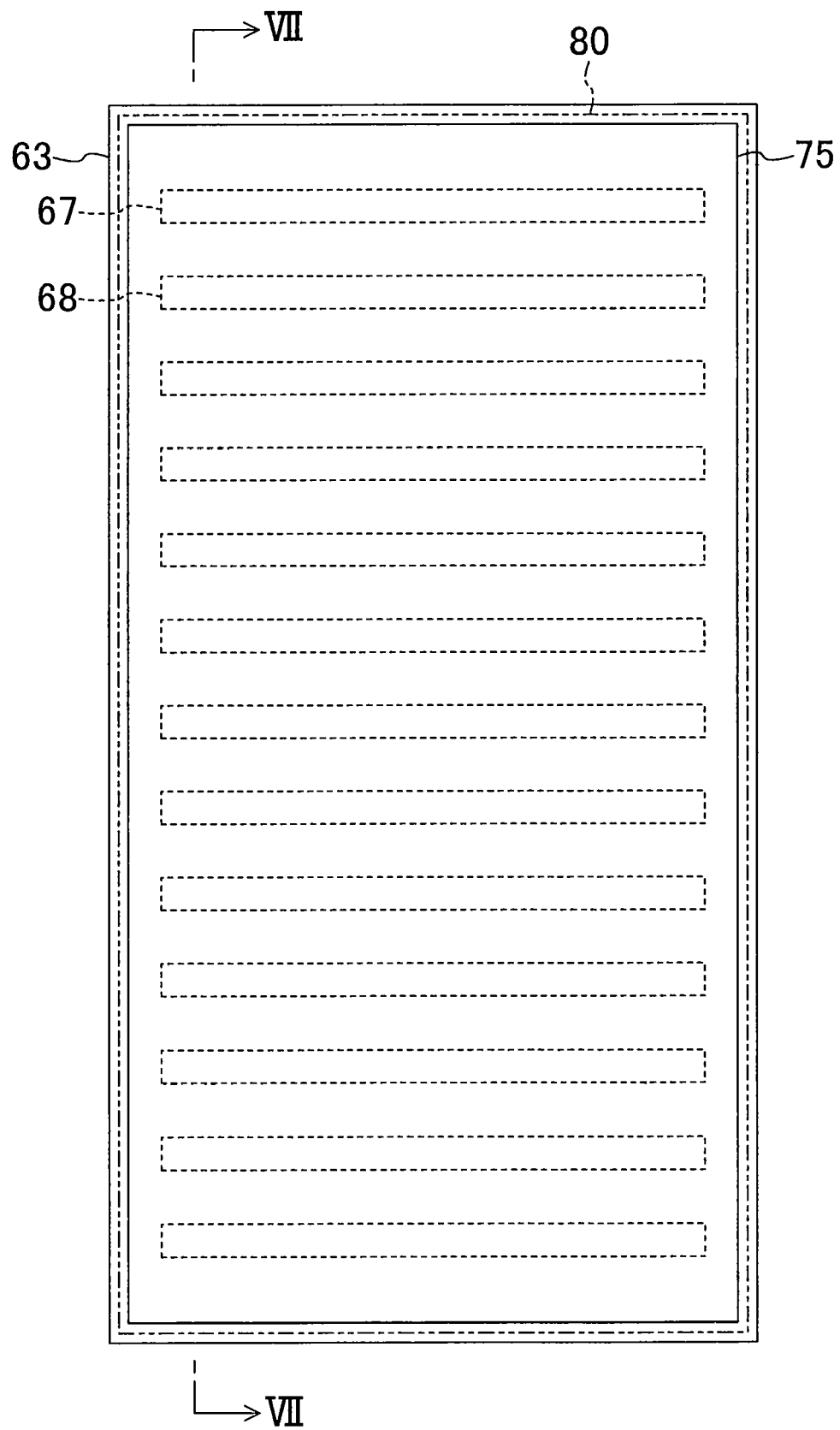
FIG. 6 is a plan view of a nitride semiconductor device according to a second embodiment of the invention.
Figure 7:
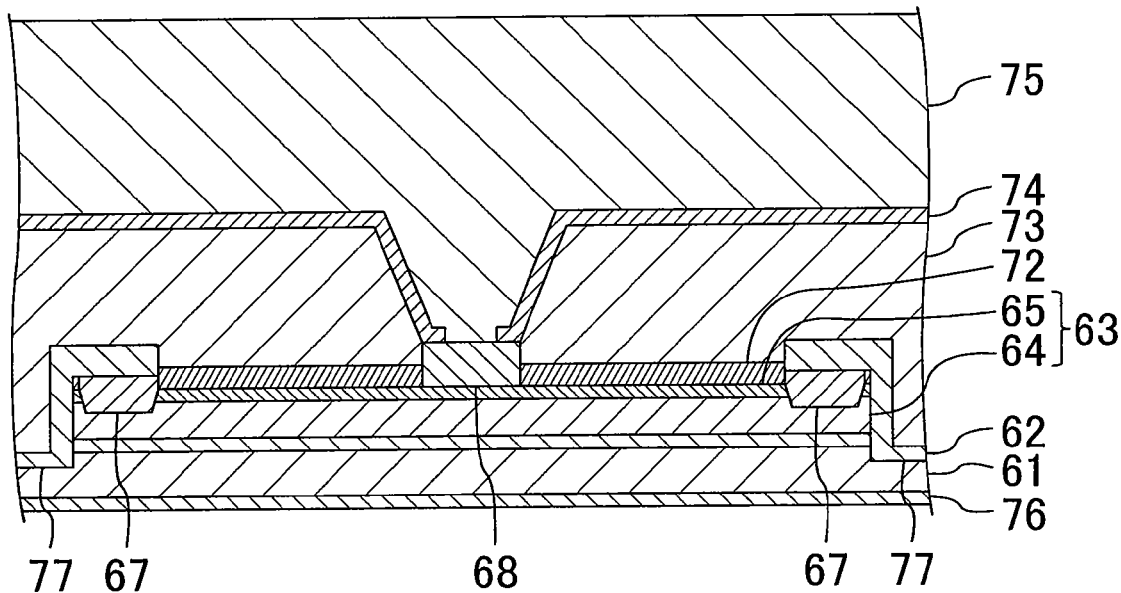
FIG. 7 is a cross-sectional view of the nitride semiconductor device according to the second embodiment of the invention.
Figure 8:
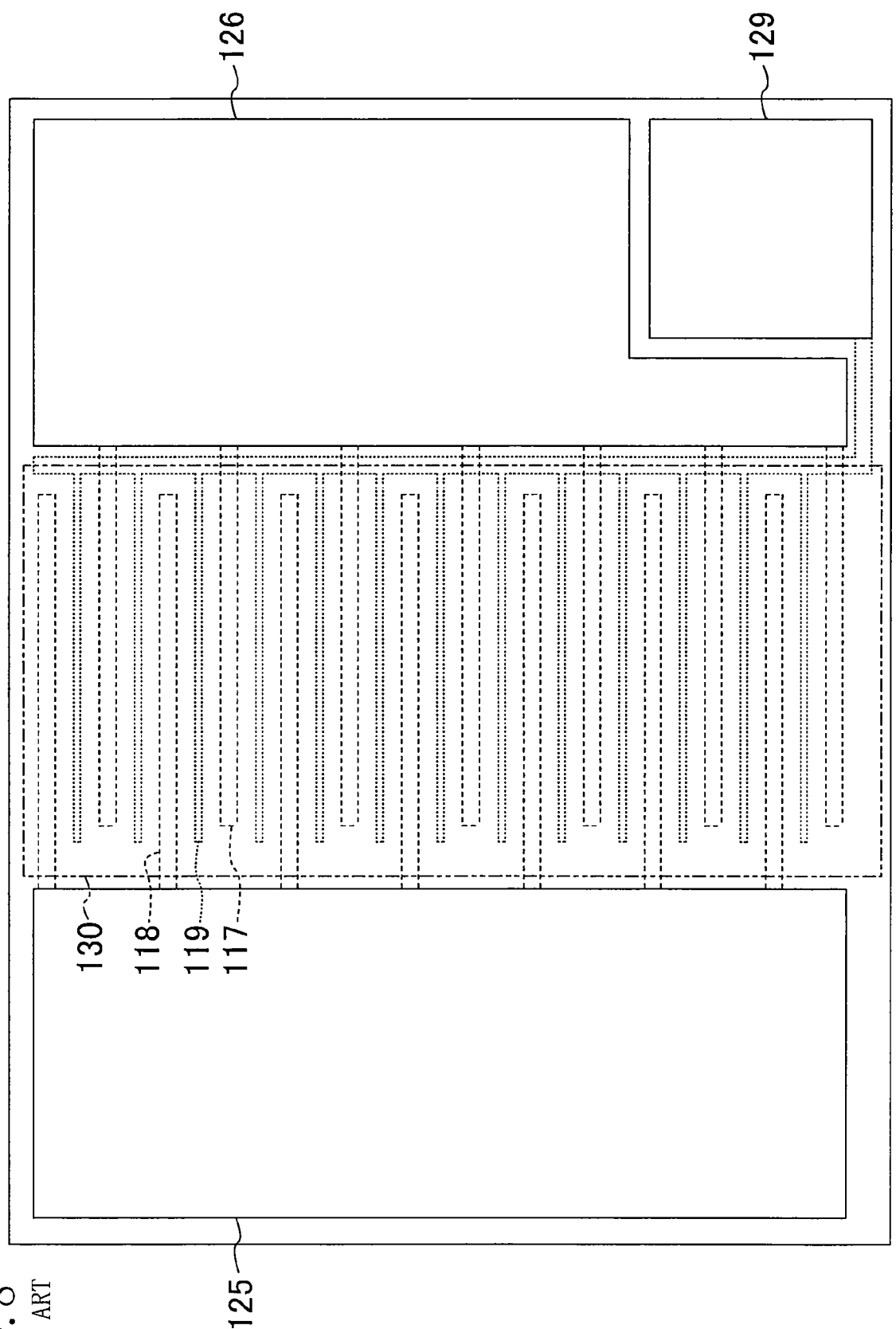
FIG. 8 is a plan view of a conventional nitride semiconductor device.

Hereinafter, a second embodiment of the invention will be described with reference to the accompanying drawings. FIG. 6 shows a planar structure of a nitride semiconductor device according to the second embodiment. FIG. 7 shows a cross-sectional structure taken along line VII-VII of FIG. 6.

As shown in FIGS. 6 and 7, the nitride semiconductor device of the second embodiment has a nitride semiconductor layer 63 formed on an electrically conductive silicon (Si) substrate 61 with a buffer layer 62 interposed therebetween. The nitride semiconductor layer 63 is formed from an undoped gallium nitride (GaN) layer 64 having a thickness of 2 μm and an undoped aluminum gallium nitride (AlGaN) layer 65 having a thickness of 25 nm. The undoped GaN layer 64 and the undoped AlGaN layer 65 are sequentially formed over the substrate 61 in this order. A two-dimensional electron gas (2DEG) is generated in an interface region of the undoped GaN layer 64 with the undoped AlGaN layer 65.

A cathode electrode 67 and an anode electrode 68 are formed spaced apart from each other on the nitride semiconductor layer 63. In this embodiment, the cathode electrode 67 is formed from titanium (Ti) and aluminum (Al) and reaches a level lower than the interface between the undoped AlGaN layer 65 and the undoped GaN layer 64. The anode electrode 68 is formed from palladium (Pd) and is in contact with the top surface of the undoped AlGaN layer 65.

The nitride semiconductor device of this embodiment is a multi-finger diode. In this embodiment, a region where a group of cathode electrodes 67 and anode electrodes 68 are formed in the nitride semiconductor layer 63 is referred to as an active region 80.

A first insulating film 72 is formed on the undoped AlGaN layer 65 except on the region where the cathode electrode 67 and the anode electrode 68 are formed. An interlayer insulating film 73 is formed on the first insulating film 72. The first insulating film 72 is a silicon nitride (SiN) film and the interlayer insulating film 73 is a phosphorus containing silicon oxide ($SiO_2$) film having a thickness of 6 μm. The interlayer insulating film 73 has an opening that exposes the anode electrode 68. A second insulating film 74 is formed on the interlayer insulating film 73 and covers the side surface of the opening. The second insulating film 74 is a SiN film having a thickness of 0.2 μm. In this embodiment, the width of the opening is 4.5 μm.

A first electrode pad 75 is formed in a region over the active region 30 on the second insulating film 74. The first electrode pad 75 is formed from aluminum (Al) and copper (Cu) and has a thickness of 4 μm. The first electrode pad 75 fills the opening and is electrically connected to the anode electrode 68.

A second electrode pad 76 is formed on the back surface of the substrate 61. The second electrode pad 76 is formed from tin (Sn) and gold (Au). The cathode electrode 67 is electrically connected to the electrically conductive substrate 61 through a via plug 77 that extends through the nitride semiconductor layer 63. Therefore, the cathode electrode 67 and the second electrode pad 76 are electrically connected to each other.

In the nitride semiconductor device of this embodiment, the first electrode pad 75 connected to the anode electrode 68 is formed over the active region 80, the size of the nitride semiconductor device can be reduced as compared to the case where the first electrode pad 75 is formed over a region other than the active region 80.

Since the second electrode pad 76 connected to the cathode electrode 67 is formed on the back surface of the substrate 61, the size of the nitride semiconductor device can further be reduced.

In the second embodiment as well, the first electrode 25 may be structured as shown in FIG. 3 or 4, and the second electrode pad 26 may be formed on the same side of the substrate 61 as the first electrode pad 25 as shown in FIG. 5.

In this embodiment, the cathode electrode 67 is connected to the second electrode pad 76 and the anode electrode 68 is connected to the first electrode pad 75. However, the cathode electrode 67 may be connected to the first electrode pad 75 and the anode electrode 68 may be connected to the second electrode pad 76.

As has been described above, the invention implements a nitride semiconductor device having a smaller device area while assuring the area of an electrode pad. The invention is especially useful as devices such as a nitride semiconductor device that is used as a power device in power supply circuits of household appliances and the like.

The description of the embodiments of the present invention is given above for the understanding of the present invention. It will be understood that the invention is not limited to the particular embodiments described herein, but is capable of various modifications, rearrangements, and substitutions as will now become apparent to those skilled in the art without departing from the scope of the invention. Therefore, it is intended that the following claims cover all such modifications and changes as fall within the true spirit and scope of the invention.

What is claimed is:

1. A nitride semiconductor device, comprising:
   a substrate;
   a nitride semiconductor layer formed on a main surface of the substrate and having a channel region through which electrons drift in a direction parallel to the main surface;
   a plurality of first electrodes and a plurality of second electrodes formed spaced apart from each other so as to be alternately arranged on an active region in the nitride semiconductor layer;
   a first insulating film and an interlayer insulating film sequentially formed on the nitride semiconductor layer in this order and having a plurality of openings that expose the respective first electrodes;
   a first electrode pad formed in a region on the interlayer insulating film over the active region and electrically connected to an exposed portion of each of the first electrodes through the respective openings, and
   a third electrode that is formed in a region between each first electrode and each second electrode on the nitride semiconductor layer and serves as a gate electrode of a field effect transistor, wherein each of the first electrodes is one of a drain electrode and a source electrode of the field effect transistor and each of the second electrodes is another one of the drain electrode and the source electrode.

2. The nitride semiconductor device according to claim 1, wherein the substrate is electrically conductive, the nitride semiconductor device further comprising a second electrode pad formed on an opposite surface of the main surface of the substrate, the second electrode pad being electrically connected to the second electrodes.

3. The nitride semiconductor device according to claim 1, wherein a thickness of the first electrode pad is one half or more of a width of the openings, and the first electrode pad is formed so as to fill the openings and has a planarized top surface.

4. The nitride semiconductor device according to claim 1, wherein the interlayer insulating film is formed from phosphorus-containing silicon oxide, polyimide, or benzocyclobutene.

5. The nitride semiconductor device according to claim 4, wherein the interlayer insulating film has a thickness of 2 μm or more.

6. The nitride semiconductor device according to claim 5, wherein the interlayer insulating film has a thickness of 5 μm or more.

7. The nitride semiconductor device according to claim 1, further comprising a second insulating film that covers at least a region other than the region where the first electrode pad is formed on the interlayer insulating film.

8. The nitride semiconductor device according to claim 7, wherein the second insulating film is formed from silicon nitride.

9. A nitride semiconductor device, comprising:
   a substrate;
   a nitride semiconductor layer formed on a main surface of the substrate and having a channel region through which electrons drift in a direction parallel to the main surface;
   a plurality of first electrodes and a plurality of second electrodes formed spaced apart from each other so as to be alternately arranged on an active region in the nitride semiconductor layer;
   a first insulating film and an interlayer insulating film sequentially formed on the nitride semiconductor layer in this order and having a plurality of openings that expose the respective first electrodes; and a first electrode pad formed in a region on the interlayer insulating film over the active region and electrically connected to an exposed portion of each of the first electrodes through the respective openings, wherein a thickness of the first electrode pad is less than one half of a width of the openings, and the first electrode pad is formed so that a recess is formed in a region that covers a side surface of each of the openings and an exposed top surface of each of the first electrodes from the corresponding opening, the nitride semiconductor device further comprising a filling layer for filling the recess for planarization.

10. The nitride semiconductor device according to claim 9, further comprising a metal film that covers the first electrode pad and the filling layer.

11. A nitride semiconductor device, comprising:

a substrate;

a nitride semiconductor layer formed on a main surface of the substrate and having a channel region through which electrons drift in a direction parallel to the main surface;

a plurality of first electrodes and a plurality of second electrodes formed spaced apart from each other so as to be alternately arranged on an active region in the nitride semiconductor layer;

a first insulating film and an interlayer insulating film sequentially formed on the nitride semiconductor layer in this order and having a plurality of openings that expose the respective first electrodes; and a first electrode pad formed in a region on the interlayer insulating film over the active region and electrically connected to an exposed portion of each of the first electrodes through the respective openings, wherein each of the first electrodes is one of an anode electrode and a cathode electrode of a diode and each of the second electrodes is another one of the anode electrode and the cathode electrode.

* * * * *